(12) United States Patent
Nishimoto et al.

(10) Patent No.: US 6,451,441 B1
(45) Date of Patent: Sep. 17, 2002

(54) FILM WITH METAL FOIL

(75) Inventors: Akihiko Nishimoto, Kokubu (JP); Katsura Hayashi, Kokubu (JP); Yasuhiko Ohyama, Osaka (JP); Shigeru Danjo, Hasuda (JP); Kazuhiro Shimomura, Hasuda (JP)

(73) Assignees: Kyocera Corporation, Kyoto (JP); Sekisui Chemical Corporation, Osaka (JP)

( * ) Notice: Subject to any disclaimer, the term of this patent is extended or adjusted under 35 U.S.C. 154(b) by 0 days.

(21) Appl. No.: 09/539,261

(22) Filed: Mar. 30, 2000

(30) Foreign Application Priority Data

Mar. 30, 1999 (JP) ............................................. 11-089825

(51) Int. Cl.$^7$ ............................................. B32B 15/08
(52) U.S. Cl. ..................... 428/461; 428/457; 428/463
(58) Field of Search ................. 428/461, 463; 525/222, 259, 329.9; 526/318.4, 319

(56) References Cited

U.S. PATENT DOCUMENTS

| | | | | |
|---|---|---|---|---|
| 4,199,646 A | * | 4/1980 | Hori et al. .................. 428/344 |
| 4,522,965 A | * | 6/1985 | Waniczek et al. ........... 524/109 |
| 5,071,914 A | * | 12/1991 | Zimmel et al. ............. 525/113 |
| 6,207,272 B1 | * | 3/2001 | Takahira et al. ............ 428/355 |

* cited by examiner

Primary Examiner—Paul Thibodeau
Assistant Examiner—Monique R Jackson
(74) Attorney, Agent, or Firm—Hogan & Hartson, L.L.P.

(57) ABSTRACT

In a film with metal foil of the present invention, a metal foil is stuck to the surface of a resin film via an adhesive layer. The adhesive is formed by crosslinking an acrylic polymer obtained by the copolymerization of a (meth)acrylic acid ester with a carboxyl group-containing radically polymerizable monomer, with a polyfunctional compound having a functional group reactive with the carboxyl group. The film with metal foil is very useful for producing a multi-layer wiring board by the so-called transfer method. By using this film, there can be produced a multi-layer wiring board having a fine and highly dense wiring/circuit layer and having a very excellently flat surface.

8 Claims, 2 Drawing Sheets

FILM WITH METAL FOIL

BACKGROUND OF THE INVENTION

1. Field of the Invention

The present invention relates to a film with metal foil. More specifically, the invention relates to a film with metal foil useful for producing a circuit sheet which is used in the production of a multi-layer wiring board such as a package for containing a semiconductor element and to a film with metal foil useful for producing the multi-layer wiring board from the circuit sheet.

2. Description of the Prior Art

It is a modern trend toward producing electronic devices in ever small sizes. In these circumstances, the development of portable data terminals and the widespread use of a so-called mobile computing for executing the operation by bringing a computer, have further urged the devices to be realized in smaller sizes and the multi-layer wiring board contained in the electronic devices to be fabricated in smaller sizes and in smaller thicknesses yet forming more fine circuitry.

Further, electronic equipment that must operate at high speeds have been widely used as represented by communications equipment. In order to cope with such electronic equipment, it has been urged to provide a multi-layer printed wiring board adapted to high-speed operation. The high-speed operation involves a variety of requirements such as a correct switching operation for the signals of a high frequency. To execute the high-speed operation, it becomes necessary to shorten the length of the wirings, to decrease the width of the wirings, to decrease the gap among the wirings, and to shorten the time required for the propagation of electric signals. That is, the multi-layer wiring board must be realized in a small size, in a decreased thickness and forming a fine circuitry (highly dense circuitry) even from the standpoint of coping with a high-speed operation.

A build-up method has been known for producing a multi-layer wiring board that satisfies the above-mentioned requirements.

According to the build-up method, first, a wiring/circuit layer is formed on the surface of an insulating board made of a glass-epoxy composite material, and through-hole conductors are formed so as to be electrically joined to the wiring/circuit layer on the surface, thereby to fabricate a core board.

Next, a photosensitive resin is applied onto the surface of the core board to form an insulating layer, which is then exposed to light and is developed to form via-holes in the insulating layer.

A layer such as of copper or the like is plated on the whole surface of the insulating layer inclusive of the surfaces of the via-holes. Further, a photosensitive resist is applied onto the surface of the plated layer followed by exposure to light, developing, etching and removal of resist to form the wiring/circuit layer.

Next, as required, the insulating layer is formed and the wiring/circuit layer is formed by using the resist repetitively in order to obtain a wiring board of a multi-layer structure having a plurality of circuit boards laminated on the core board.

In recent years, further, there has been developed a build-up method in which a copper foil onto which an uncured thermosetting resin is applied is laminated on a core board, instead of laminating an insulating layer on the core board using a photosensitive resin.

That is, the copper foil is stuck onto the surface of the core board by the hot press or the like method with the uncured thermosetting resin layer sandwiched therebetween, followed by heating to cure the thermosetting resin thereby to form an insulating layer having a copper foil on the surface. Then, via-holes are formed in the copper foil and in the insulting layer by using a carbonic acid gas laser or the like laser. Then, in the same manner as the above-mentioned method, a plated layer is formed, resist is applied, exposure to light is effected, developing is effected, etching is effected and the resist is removed to form a wiring/circuit layer. Then, as required, the above-mentioned steps are repeated to obtain a wiring board having a multi-layer structure in which a plurality of circuit boards are laminated on the core board.

However, the following problems are involved when it is attempted to produce the multi-layer wiring board relying upon the above-mentioned build-up method.

A first problem is that the resin constituting an insulating layer laminated on the core board loses characteristics. That is, according to the above build-up method, a photosensitive epoxy resin is generally used for forming an insulating layer. The epoxy resin, however, has a low glass transition point and further has photosensitive property. When the multi-layer wiring board obtained by this method is left to stand, therefore, the coefficient of water absorption increases. When left to stand under high-temperature and high-humidity conditions, in particular, the multi-layer wiring board loses insulating property and, hence, loses reliability of the circuit.

A second problem is that the circuit is not intimately adhered. According to the above-mentioned build-up method in which the wiring/circuit layer is formed on the insulting layer by the plating method, in particular, the adhesive strength is small between the wiring/circuit layer and the insulating layer. When, for example, the obtained multi-layer wiring board is heated by solder reflow or the like, the wiring/circuit layer is peeled off or swells.

A third problem is that the obtained multi-layer wiring board lacks surface smoothness. For example, according to the former build-up method for forming the insulating layer by applying the photosensitive resin, the photosensitive resin is in a liquid form. Accordingly, ruggedness in the surface of the core board is reflected up to the surface of the multi-layer wiring board that is built up to form ruggedness. It is expected that directly connecting a silicon chip such as flip chip on the surface of the multi-layer wiring board will become a main stream of mounting the silicon chips in the future. However, the flip chip mounting requires a high degree of flatness on the surface of the board, and the board having a rugged surface as described above does not permit the silicon chips to be mounted.

The latter build-up method that uses a copper foil onto which a half-cured thermosetting resin is applied, is superior to the former build-up method that involves the above-mentioned first and second problems. However, the wiring/circuit layer formed on the surface of the insulating layer is protruding beyond the surface of the insulating layer still involving the third problem which is concerned with the surface flatness.

Besides, according to the latter build-up method, the wiring/circuit layer is formed by plating copper on the surface of the copper foil. Therefore, the wiring/circuit layer is thick making it difficult to form a highly dense and fine wiring/circuit layer. Accordingly, improvements are required such as decreasing the thickness of the copper foil by half-etching.

SUMMARY OF THE INVENTION

It is therefore an object of the present invention to provide a film with metal foil useful for the manufacture of a multi-layer wiring board having fine and highly dense wiring/circuit layers and featuring excellent surface flatness, overcoming various problems inherent in the build-up method.

Another object of the present invention is to provide a method of producing a circuit sheet for constituting the layers of the multi-layer wiring board and a method of producing the multi-layer wiring board using the circuit sheets.

According to the present invention, there is provided a film with metal foil in which a metal foil is stuck to one surface of a resin film via an adhesive layer; wherein said adhesive layer is formed of an adhesive obtained by crosslinking an acrylic polymer obtained by the copolymerization of a (meth)acrylic acid ester with a carboxyl group-containing radically polymerizable monomer, with a polyfunctional compound having a functional group reactive with the carboxyl group; and said adhesive has a storage modulus of shearing elasticity G' of not smaller than $2 \times 10^5$ dynes/cm$^2$ ($2 \times 10^4$ Pa) and a loss tangent tan δ of not smaller than 0.1 at 40° C., and a storage modulus of shearing elasticity G' of not smaller than $5 \times 10^5$ dynes/cm$^2$ ($5 \times 10^4$ Pa) and a loss tangent tan δ of not larger than 0.04 at 120° C.

According to the present invention, there is further provided a method of producing a circuit sheet for a multi-layer wiring board comprising:

working a metal foil of a film with metal foil into a circuit pattern by a resist method thereby to prepare a transfer sheet having a wiring/circuit layer;

press-adhering said transfer sheet onto a surface of an insulating sheet of a half-cured thermosetting resin in a manner that the wiring/circuit layer faces the surface of the insulating sheet; and peeling off a resin film of the transfer sheet in order to obtain a circuit sheet having the wiring/circuit layer transferred onto the surface of the insulating sheet in a manner of being buried therein.

According to the present invention, there is further provided a method of producing a multi-layer wiring board by overlapping a plurality of the circuit sheets obtained above one upon another and heat-curing the insulating sheets while press-adhering them together.

The film with metal foil of the present invention has a distinguished feature in the use of the adhesive that is obtained by crosslinking the acrylic polymer with a lo polyfunctional compound having reactivity with the carboxyl group. That is, since the metal foil has been stuck to the resin film with such an adhesive, the resin film can be easily peeled off the metal foil. By utilizing this property, the metal foil can be transferred onto the surface of a soft resin sheet (e.g., a half-cured thermosetting resin sheet). Besides, the adhesive exhibits excellent resistance against chemicals, i.e., exhibits excellent resistance even against the chemicals used for etching after the application of resist, exposure to light and developing, and against the chemicals used for the removal of resist. The adhesiveness is not deteriorated even by such chemical solutions. Therefore, the film with metal foil enables the metal foil to be easily formed into any circuit patterns by applying the resist and etching.

As described above, the film with metal foil of the present invention enables the metal foil to be excellently transferred and formed in the shape of a circuit pattern. It is thus allowed to form a transfer sheet having a wiring/circuit layer on the surface thereof by using the film with metal foil and, hence, to easily produce a circuit sheet for a multi-layer wiring substrate by using this transfer sheet.

According to the method of producing the circuit sheet for the multi-layer wiring board, the wiring/circuit layer formed of the metal foil is transferred, in a buried form, onto the surface of the half-cured thermosetting resin sheet (corresponds to the core substrate of the multi-layer wiring board or to the insulating layer laminated on the core substrate). Accordingly, the circuit sheet that is obtained features excellent surface smoothness, and makes it possible to fabricate a multi-layer wiring board having excellent surface smoothness by heating and curing the thermosetting resin after having overlapped a predetermined number of pieces of the circuit sheets one upon the other and having press-adhered them together.

In the multi-layer wiring board obtained by using the circuit sheet, no photosensitive resin has been used for forming the insulating layer. Even when the multi-layer wiring board is left to stand under high-temperature and high-humidity conditions, therefore, the insulating property is not deteriorated that results from the hygroscopic property.

In such a multi-layer wiring board, further, the wiring/circuit layer formed in each circuit sheet is buried in the insulating layer and, hence, the adhesion strength is high between the wiring/circuit layer and the insulating layer. Even in the after-treatment such as solder reflow, therefore, the wiring/circuit layer is effectively prevented from being peeled off or swollen.

Further, the wiring/circuit layer is formed without plating copper on the metal foil and, hence, does not become too thick lending itself well for increasing the density of the wiring/circuit layer, decreasing the size of the board and decreasing the thickness.

When the multi-layer wiring board is to be produced by using the above-mentioned film with metal foil, the insulating sheet constituting the insulating board and the wiring/circuit layer can be simultaneously formed through separate steps, enabling the productivity to be markedly increased.

Figure 1A:
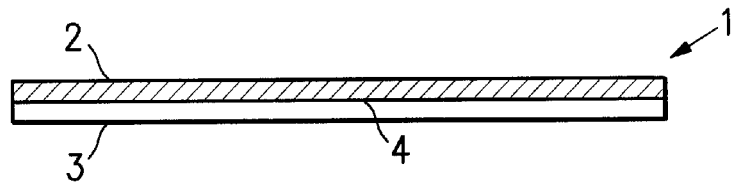
FIGS. 1(a)–1(d) depict the steps of a process for producing a transfer sheet, according to the invention.
Figure 1B:
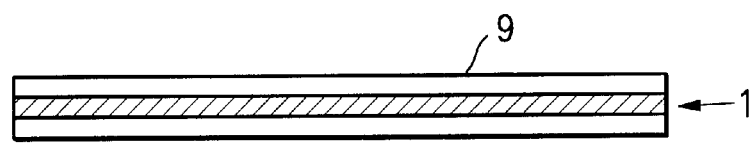
Figure 1C:
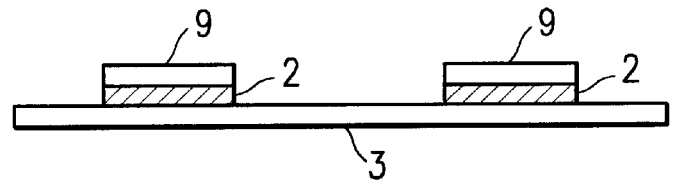
Figure 1D:
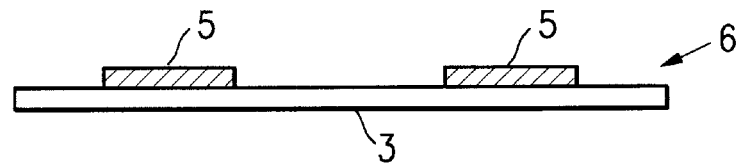
Figure 2A:
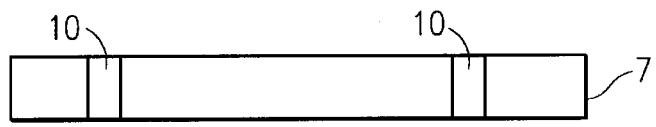
FIGS. 2(a)–2(g) depict the steps of a process for forming a circuit sheet from the transfer sheet FIGS 1(a)–1(d) by assembling a plurality of the circuit sheets into a multi-layer wiring board, according to the invention.
Figure 2B:
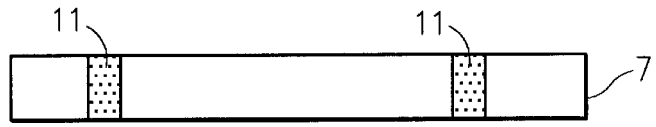
Figure 2C:
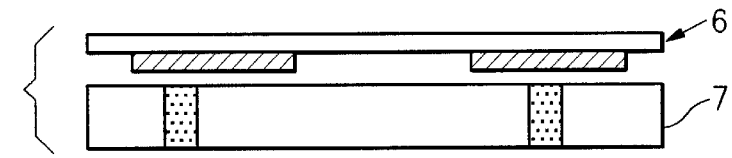
Figure 2D:
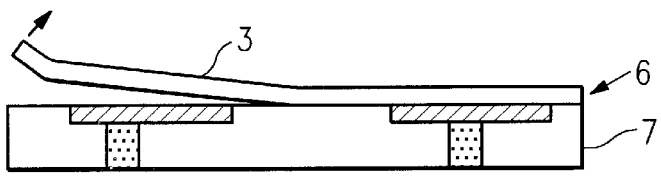
Figure 2E:
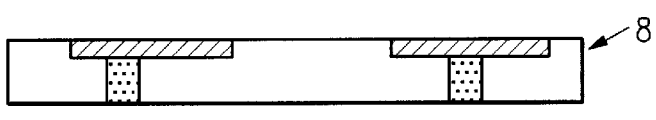
Figure 2F:
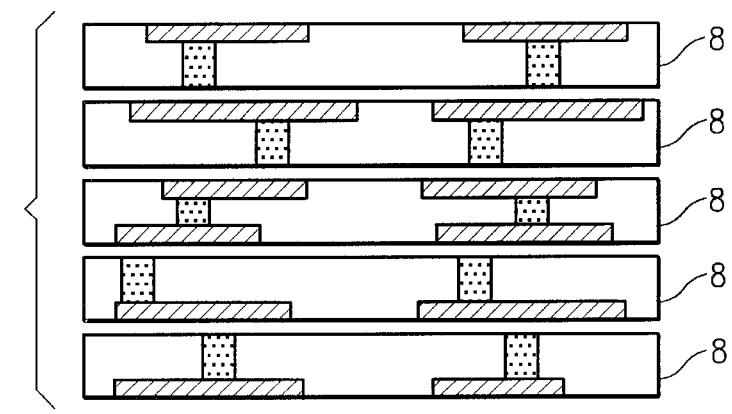
Figure 2G:
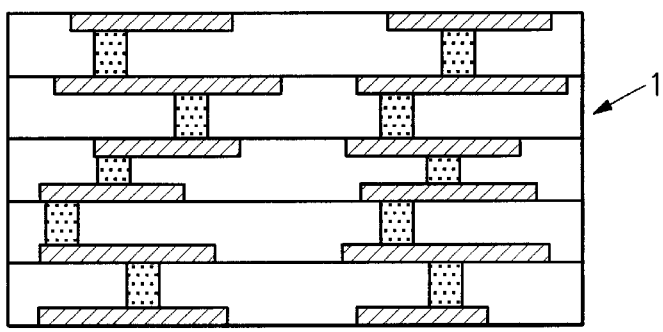

DETAILED DESCRIPTION OF THE INVENTION (Film with metal foil)

A film with metal foil of the 1, invention has a metal foil 2 stuck to one surface of the resin film 3, via an adhesive layer 4.

As the resin film, there can be used a known resin film having a suitable degree of flexibility such as of polyester like polyethylene terephthalate, polyolefin like polypropylene or polyethylene, or a resin like polyvinyl chloride, polyimide or polyphenylene sulfide.

It is desired that the resin film has a thickness of from 10 to 500 μm and, particularly, from 20 to 300 μm. When the thickness is smaller than the above range, the wiring/circuit layer tends to be broken due to deformation or folding of the film when the metal foil is worked into a circuit pattern to form the wiring/circuit layer. When the thickness is larger than the above range, on the other hand, the film loses flexibility, and it becomes difficult to peel the film off the metal foil (wiring/circuit layer).

As the metal foil, there can be used the foil of a metal having a small resistance suited for forming the wiring layer on the wiring board, such as gold, silver, copper, aluminum or the like, or an alloy containing at least one kind of such low-resistance metal.

It is desired that the metal foil has a thickness of from 1 to 100 μm and, particularly, from 5 to 50 μm. When the thickness is smaller than the above range, the wiring/circuit layer formed of the metal foil exhibits an increased resistivity and becomes not suited for producing the wiring board. When the thickness is larger than the above range, on the other hand, the insulating board or the insulating layer is greatly deformed at the time of lamination for producing the wiring board that will be described later, the wiring/circuit layer is buried in an increased amount when the wiring/circuit layer formed of the metal foil is transferred onto the insulating sheet, the insulating sheet is greatly distorted, and deformation takes place when the resin is to be cured. Besides, when the wiring/circuit layer is formed by etching the metal foil, it becomes difficult to effect the etching, making it difficult to obtain a fine circuit maintaining high degree of precision.

In order to increase the adhering force to the resin film, further, the surface of the metal foil may be coarsened to form fine ruggedness on the surface thereof on the side of the resin film. For example, fine ruggedness may be formed in the surface of the metal foil so as to possess the surface roughness Ra (JIS B0601) of from about 0.2 to about 0.7 μm. In order to increase the adhering force between the metal foil and the resin film, further, a coupling agent may be applied onto the surface of the metal foil. But, in order to easily peel off the resin film, it is desired that the coupling agent is not used.

The surface of the metal foil on the side opposite to the resin film may also be coarsened in the same manner as described above to form fine ruggedness of a similar surface roughness to enhance the adhering force between the insulating sheet and the wiring/circuit layer.

As the adhesive for forming the adhesive layer, there can be used the one obtained by crosslinking an acrylic polymer which is obtained by the copolymerization of a (meth) acrylic acid ester with a radically polymerizable monomer containing a carboxyl group, with a polyfunctional compound having a functional group reactive with the carboxylic acid.

The metal foil stuck onto the resin film using the above adhesive can be formed into a circuit pattern by etching. Upon adhering the circuit pattern onto the insulating sheet by the application of pressure, further, the resin film can be peeled off without leaving the adhesive on the metal foil.

In the adhesive used in the present invention, there can be favorably used a (meth)acrylic acid ester represented by the following general formula (1), $$CH_2=CR^1—COOR^2 \tag{1}$$

wherein $R^1$ is a hydrogen atom or a methyl group, and $R^2$ is an alkyl group having 4 to 10 carbon atoms.

In the above general formula (1), the alkyl group of $R^2$ may be a butyl group, a pentyl group, a hexyl group, a heptyl group, an octyl group, a nonyl group, a decyl group or a 4-methyl-1-pentyl group, or may further be a substituted alkyl group in which some hydrogen atoms of the alkyl group are substituted by halogen atoms or hydroxyl groups.

As such a (meth)acrylic acid ester represented by the general formula (1), there can be particularly preferably used a butyl (meth)acrylate or an octyl (meth)acrylate, which may be used in one kind or in a combination of two or more kinds in the invention.

The carboxyl group-containing radically polymerizable monomer copolymerized with the (meth)acrylic acid ester controls the polarity of the acrylic polymer that is formed, and works as crosslinking points by forming chemical bonds with the polyfunctional compound that will be described later. Its examples include an acrylic acid and a methacrylic acid having a radically polymerizable unsaturated double bond and a carboxyl group in the molecules.

It is desired that the carboxyl group-containing radically polymerizable monomer is used in an amount of from 1 to 20 parts by weight and, particularly, from 3 to 10 parts by weight per 100 parts by weight of the (meth)acrylic acid ester. When the amount is smaller than the above range, it becomes difficult to obtain an adhesive having a suitable degree of adhesive force. When the amount is larger than the above range, on the other hand, the glass transition point of the formed polymer becomes too high or the crosslinking points are formed too much, making it difficult to obtain an adhesive having a suitable degree of softness and adhesive force.

The polyfunctional compound for crosslinking the acrylic polymer that is obtained by the copolymerization of the (meth)acrylic acid ester with the carboxyl group containing radically polymerizable monomer, has, in the molecules thereof, a plurality of functional groups capable of reacting with the carboxyl groups, such as isocyanate groups, epoxy groups or metal chelate. Its concrete examples include toluene diisocyanate (TDI), 4,4-diphenylmethane diisocyanate (MDI), xylene diisocyanate (XDI), aluminum trisethylacetoacetate (AlCH-YR), etc.

That is, such a polyfunctional compound reacts with the acrylic polymer to form a crosslinking structure, making it possible to obtain an adhesive having a suitable degree of adhesiveness.

There can be further used a monofunctional compound having one functional group, such as butyl glycidyl ether together with the above polyfunctional compound. It is desired that the monofunctional compound is used in an amount of not larger than 50 parts by weight per 100 parts by weight of the polyfunctional compound. That is, when the amount of the monofunctional compound becomes too great with respect to the polyfunctional compound, it becomes difficult to obtain a sufficient degree of crosslinking structure.

The mixture of the acrylic polymer and the polyfunctional compound can be easily crosslinked by applying the mixture to the metal foil or the resin film followed by heating and drying.

It is desired that the degree of crosslinking is such that the gel fraction is not smaller than 70% by weight and, particularly, not smaller than 80% by weight. The degree of crosslinking is related to the cohesive force of the adhesive at normal temperature or at a high temperature. When the gel fraction is smaller than the above range, the adhesive strength becomes too great between the resin film and the wiring/circuit layer formed of the metal foil in the step of transfer, and it becomes difficult to peel off the resin film or the adhesive remains on the wiring/circuit layer.

The gel fraction is calculated according to the following formula (2),

Gel fraction=(dry weight of filtrate after immersed in the solvent)/ (weight of before immersed in the solvent)×100 (2)

by using, as a solvent, an organic solvent such as tetrahydrofuran (THF), immersing the adhesive in the solvent at a temperature of 30° C. a whole day with shaking so that it is swollen with the solvent, filtering the undissolved components using a 200-mesh gauze, drying the solvent, and measuring the weight thereof.

In the present invention, the adhesive must have a storage modulus of shearing elasticity G' of not smaller than $2 \times 10^5$ dynes/cm$^2$ ($2 \times 10^4$ Pa) at 40° C. and a loss tangent tan δ of not smaller than 0.1 at 40° C., and a storage modulus of shearing elasticity G' of not smaller than $5 \times 10^5$ dynes/cm$^2$ ($5 \times 10^4$ Pa) at 120° C. and a loss tangent tan 67 of not larger than 0.04, particulary not larger than 0.03 at 120° C.

When the storage modulus of shearing elasticity G' at 40° C. is smaller than the above range, the adhesive becomes so soft that the metal foil is peeled off at the time of forming the wiring/circuit layer in the shape of a circuit pattern by etching the metal foil, and the wiring/circuit layer that is formed may be broken. When the loss tangent tan 67 at 40° C. is smaller than the above range, too, the metal foil may be peeled off during the etching and the wiring/circuit layer may be broken.

Further, when the storage modulus of shearing elasticity G' is smaller than the above range or when the loss tangent tan 67 is larger than the above range at 120° C., a problem may occur at the time of press-adhering and transferring the transfer sheet obtained by etching the metal foil onto the insulating sheet. That is, the transfer sheet is press-adhered onto the insulating sheet to bury the wiring/circuit layer, usually, at a temperature of from about 80 to about 150° C. Here, when the modulus of shearing storage elasticity G' or the loss tangent tan 67 at 120° C. lies outside the above-mentioned range, the adhesive fluidizes in the step of transfer and the wiring/circuit layer deforms making it difficult to form a fine wiring/circuit layer maintaining high precision. Besides, the adhesive is adhered to the insulating sheet to an excess degree involving difficulty in peeling off the resin film.

In the present invention, the kinds of the acrylic polymer and polyfunctional compound, amounts thereof as well as gel fraction thereof are adjusted, so that the storage modulus of shearing elasticity G' and loss tangent tan 67 at 40° C. and 120° C. lie within the above-mentioned ranges, enabling the wiring/circuit layer to be formed by etching, and the wiring/circuit layer to be transferred from the transfer sheet having the wiring/circuit layer.

In the present invention, it is desired that the adhesive is blended with a plasticizer in an amount of from 0.05 to 5% by weight. By being blended with the plasticizer, the adhesive force between the metal foil and the adhesive can be elevated to a suitable degree. For example, the adhesive adheres to a sufficient degree to the surface of the metal foil which is formed finely rugged and, hence, the etching solution infiltrates little into between the adhesive and the metal foil during the etching, effectively preventing the metal foil from being peeled off or the wiring/circuit layer from being broken. Further, since a suitable degree of adhesive force is maintained, the resin film can be easily peeled off even when the wiring/circuit layer formed by etching the metal foil is transferred onto the insulating sheet. It is considered that a trace amount of the plasticizer bleeds out to the surface of the adhesive layer to wet the surface of the metal foil. When the amount of the plasticizer is smaller than the above range, the above advantage resulting from the blending of the plasticizer is not exhibited to a sufficient degree. When the plasticizer is blended in an amount larger than the above range, on the other hand, the adhesive becomes so soft that the adhesive may remain on the wiring/circuit layer when, for example, the wiring/circuit layer is transferred and the resin film is peeled off.

As the plasticizer, there can be used an aliphatic dibasic acid such as adipic acid diester or the like, an aromatic dibasic acid ester such as phthalic acid diester or the like, or a phosphorus acid-type plasticizer. From the standpoint of compatibility with the acrylic polymer and bleed-out property, however, it is desired to use a phthalic acid diester or an aliphatic dibasic acid ester. Among them, it is most desired to use the adipic acid diester and, particularly, a di-2-ethylhexyl adipate.

It is desired that the above adhesive is blended with an epoxy plasticizer in an amount of from 0.01 to 1% by weight. As the epoxy plasticizer, there can be exemplified an epoxylated soybean oil and an epoxylated linseed oil. By being blended with the epoxy plasticizer, peeling property is improved between the metal foil and the adhesive. When the epoxy plasticizer is blended in an amount of larger than 1% by weight, the adhesive force is not obtained to a sufficient degree between the metal foil and the resin film, permitting the peeling to occur in the step of etching.

The adhesive may be further blended with a benzotriazole-type anti-corrosive agent. By being blended with the anti-corrosive agent, the metal foil is effectively prevented from being excessively corroded at the time of etching and, particularly, fine wiring portions and corner portions of the wiring/circuit layer are effectively prevented from being excessively corroded. The anti-corrosive agent can be blended in any amount as far as the adhesive does not lose the above-mentioned properties.

The above-mentioned plasticizer and the anti-corrosive agent can be blended at any stage. Generally, however, the acrylic polymer of before being crosslinked is blended with the plasticizer and the anti-corrosive agent.

The film with metal foil of the invention can be obtained by applying the above adhesive to the surface of the metal foil or to the surface of the resin film, and press-adhering them together. In this case, it is desired that the adhesive layer formed of the adhesive has a thickness of from about 1 to about 30 μm. When the thickness is too small, the metal foil is not held on the resin film with a sufficiently large adhesive force, and the metal foil tends to be peeled off. When the thickness is too large, on the other hand, the adhesive tends to stay on the wiring/circuit layer when the resin film is peeled off after the wiring/circuit layer is transferred.

The thus obtained film with metal foil of the invention exhibits an adhesive force of the adhesive layer of, usually, from 50 to 700 g/20 mm (about 0.5 to 7.0 N/20 mm). Therefore, the metal foil is held without being peeled off even at the time of etching, and the resin film can be easily peeled off after the wiring/circuit layer is transferred. The adhesive force of the adhesive layer is measured in compliance with 180° peeling strength (JIS-Z-0237) at the time of peeling the resin film off. (Production of a circuit sheet for the multi-layer wiring board)

According to the present invention, the metal foil 2 of the above-mentioned film with metal foil 1 is shaped into a circuit pattern to form a wiring/circuit layer 5 in order to obtain a transfer sheet. 6 The transfer sheet 6 is then press-adhered onto an insulating sheet to transfer the wiring/circuit layer onto 5 the surface of the insulating sheet A'. Then, the resin film 3 of the transfer sheet 6 is peeled off to produce a circuit sheet 8 for the multi-layer wiring board A'. Preparation of the transfer sheet:

In order to form the metal foil of the film into the circuit pattern, there can be employed a resist method known per se.

That is, a photoresist 9 is applied onto the whole surface of the metal foil 2, which is then exposed to light through a mask of a predetermined pattern. After developing, the metal foil is removed from the non-pattern portions (potions from where the photoresist has been removed) by etching such as plasma etching or chemical etching A'. Thus, there is formed a wiring/circuit layer 5 on which the metal foil is formed in the shape of a circuit pattern. It is, of course, allowable to apply the photoresist onto the surface of the metal foil in the shape of a predetermined circuit pattern by screen-printing or the like and, then, to form the wiring/circuit layer by etching after exposure to light in the same manner as described above.

After the etching, the resist may remain on the wiring/circuit layer A'. By removing the remaining resist with a resist-removing solution followed by washing, it is allowed to obtain a transfer sheet 6 having the wiring/circuit layer 5 formed on the surface of the resin film A'.

In the present invention, the transfer sheet having the wiring/circuit layer is prepared as described above by using the above-mentioned film with metal foil. The metal foil is held by the resin film with a suitable degree of adhesive force. Besides, the adhesive layer exhibits resistance against chemicals used at the time of etching and suppresses the infiltration of the chemical solution, effectively preventing such an inconvenience that the metal foil is peeled off when the wiring/circuit layer is being formed by etching. As a result, it is allowed to form a fine and highly dense wiring/circuit layer maintaining a high precision. Insulating sheet:

The insulating sheet A' onto which will be transferred the wiring/circuit layer formed on the transfer sheet comprises a half-cured thermosetting resin. As the thermosetting resin, there can be used polyphenylene ether (PPE), a bismaleimide resin such as BT (bismaleimide triazine) resin or the like, or a maleimide resin, an epoxy resin, a polyimide resin, a fluorine-contained resin or a phenolic resin. Preferably, there is used a thermosetting resin which is liquid at room temperature.

The insulating sheet corresponds to the insulating substrate of the circuit board. In order to maintain a strength, in general, the filler is used together with the thermosetting resin. As the filler, there can be used an organic or inorganic powder or fiber.

As the inorganic filler, there can be used $SiO_2$, $Al_2O_3$, $ZrO_2$, $TiO_2$, AlN, SiC, $BaTiO_3$, $SrTiO_3$, zeolite, $CaTiO_3$ and aluminum borate that have been known per se. It is desired that these inorganic fillers are in the form of a nearly spherical powder having an average particle diameter of not larger than 20 $\mu$m, preferably, not larger than 10 $\mu$m and, most preferably, not larger than 7 $\mu$m, but may be in the form of a fiber having an average aspect ratio of not smaller than 2 and, particularly, not smaller than 5. Examples of the fiber filler include a glass, a woven fabric or a nonwoven fabric having any property. As the organic filler, there can be exemplified an aramid fiber, a cellulose fiber, etc.

The above various fillers can be used alone or in a combination of two or more kinds. In general, it is desired that the thermosetting resin and the filler are used at a ratio of thermosetting resin/filler=15/85 to 65/35 on the volume basis.

The insulating sheet is obtained by forming a slurry that contains the thermosetting resin or that contains the thermosetting resin and the filler into a sheet by the doctor blade method, and heating it to a semi-cured state.

It is further desired to form via-holes A' in the half-cured insulating sheet by the carbonic acid gas laser method or the like method, and fill the via-holes with a powder of a low-resistance metal such as gold, silver, copper or aluminum to form via-hole conductors A'.

The thickness of the insulating sheet is suitably selected depending upon the thickness of the multi-layer wiring board that is to be finally obtained. Transfer:

In the present invention, the transfer sheet 6 described above is overlapped on the-insulating sheet 7 in a manner that the wiring/circuit layer 5 faces the insulating sheet 7 and is press-adhered thereto A'. In this case, the portion where the surfaces of the via-hole conductors 11, formed in the insulating sheet 7 are exposed, is overlapped on the wiring/circuit layer 5.

The press-adhesion is effected with a pressure of about 0.01 to about 0.5 $N/cm^2$, so that the wiring/circuit layer is completely buried in the surface of the insulating sheet. It is desired that the press-adhesion is usually conducted being heated at about 80 to 150° C. Therefore, the wiring/circuit layer that is buried is firmly held by the insulating sheet. By coarsening the surface of the metal foil, further, fine ruggedness formed in the surface of the wiring/circuit layer meshes with the surface of the insulating sheet, and the junction strength is further enhanced between the wiring/circuit layer and the insulating sheet.

Then, by peeling the resin film 3 off the transfer sheet 6, the wiring/circuit layer is transferred onto the surface of the insulating sheet, and there is obtained a circuit sheet 8, having the wiring/circuit layer 5 on the surface A'.

The thus obtained circuit sheet has the wiring/circuit layer buried in the surface of the sheet, and has a very high degree of flatness making it possible to obtain a multi-layer circuit board having excellent flatness suited for mounting even a flip chip. (Production of the multi-layer wiring board)

The wiring board of a single layer is obtained by completely curing the insulating sheet by heating the above circuit sheet. Manufacturing the multi-layer wiring boards by using the circuit sheet is advantageous for enhancing the productivity of the multi-layer wiring boards.

That is, A' a predetermined number of circuit sheets 8 (e.g., circuit sheets in which via-holes are formed) obtained above are overlapped one upon the other in a manner that the wiring/circuit layers and the insulating sheets are alternatingly positioned, and are press-adhered together followed by heating to completely cure the insulating sheets at the same time, thereby to obtain a desired multi-layer wiring board 12.

According to this method, preparation of the insulating sheet equipped with via-hole conductors for constituting the insulating substrate and the preparation of the transfer sheet equipped with the wiring/circuit layer are simultaneously conducted through separate steps to accomplish a very high production efficiency.

In the obtained multi-layer wiring board, the wiring/circuit layer formed in each layer is completely buried in the insulating substrate of each layer, and the wiring/circuit layer of the uppermost layer, too, is buried in the surface. Accordingly, the multi-layer wiring board has very excellent flatness so as to be adapted to mounting even a flip chip, and its thickness can be decreased as much as possible.

Further, the multi-layer wiring board does not have to use the photosensitive resin as the insulating substrate material. Even when the multi-layer wiring board is left to stand under high-temperature and high-humidity conditions for extended periods of time, therefore, reliability of the circuit is not impaired. Moreover, the wiring/circuit layer is directly formed from the metal foil without the need of effecting the plating on the metal foil. Therefore, the wiring/circuit layer is not formed too much thickly, making it possible to effectively prevent the deformation of the board and to prevent a decrease in the strength thereof caused by an increase in the thickness of the wiring/circuit layer, which is very advantageous for realizing the board in a small size.

EXAMPLES

Example 1

Via-holes of a diameter of 0.1 mm were formed in a prepreg (150 μm thick) of an arylated polyphenylene ether (A-PPE) by the carbonic acid gas laser beam and were filled with a copper paste containing a silver-plated copper powder to form via-hole conductors and to prepare an insulating sheet for a multi-layer wiring board.

An acrylic polymer obtained by the copolymerization of 100 parts by weight of a butyl acrylate with 10 parts by weight of an acrylic acid, was mixed with a polyfunctional compound (an adduct of TDI (tolylene diisocyanate) of trimethylolpropane, Coronate L-45 manufactured by Nihon Polyurethane Co.), a plasticizer (d) (di-2-ethylhexyl adipate) and an anti-corrosive agent (benzotriazole), and the mixture was melt-kneaded at ratios shown in Table 1 to obtain an adhesive having a gel fraction and an index of viscoelasticity as shown in Table 1. The index of viscoelasticity was measured based on dynamic viscoelasticity spectra (frequency of 10 Hz, temperature rising rate of 2° C./min).

The adhesive was applied onto the surface of a 25 μm-thick polyethylene terephthalate (PET) film to prepare an adhesive film on which the adhesive is applied maintaining a thickness of 20 μm.

Further, an electrolytic copper foil (12 μm thick) formed by the electrolytic plating method and having a surface roughness (Ra) of 0.5 μm was adhered onto the adhesive surface of the adhesive film to prepare a film with metal foil. The surface of the copper of the film was coarsened by etching with a formic acid to adjust the surface roughness (Ra) to be 0.5 μm.

The film with metal foil was measured for its peeling force at 40° C., peeling force at 120° C., and re-peeling force at 40° C. at a peeling rate of 300 mm/min by the methods described below. The results were as shown in Table 3.
Peeling force at 40° C.:
The film immediately after the metal foil was adhered thereon was left to stand at 40° C. for 30 minutes, and was measured for its 180° peeling strength at 40° C.
Peeling force at 120° C.:
The film immediately after the metal foil was adhered thereon was left to stand at 120° C. for 30 minutes, and was measured for its 180° peeling strength at 120° C.
Re-peeling Force at 40° C.:
The pressure of 30 kg/cm$^2$ (about 300 N/cm$^2$) was applied at 130° C. for 30 seconds, and the peeling force was measured at 40° C.

A photosensitive resist was applied onto the surface (coarsened surface) of the copper foil of the film, a circuit pattern was formed by exposure to light through a glass mask, and the film was immersed in a solution of ferric chloride to form a wiring/circuit layer of the shape of the circuit pattern by removing the non-patterned portions by etching at an etching rate of 35 μm/minute. Further, the resist remaining on the wiring/circuit layer was removed by using an aqueous solution of sodium hydroxide in order to obtain a transfer sheet having the wiring/circuit layer formed on the PET film via the adhesive layer.

The circuit pattern on the wiring/circuit layer possessed lines of a width of 1 mm, and fine lines of a width of 50 μm maintaining a gap of 50 μm, and possessed an area corresponding to 50% that of the insulating sheet prepared above.

In effecting the etching, infiltration of the solution into between the adhesive layer and the metal foil was observed. The results were as shown in Table 3. In the Table, ○ represents a case of when no infiltration of solution was found, and X represents a case of when the infiltration was found.

The thus prepared transfer sheet was overlapped on the insulating sheet being so positioned that the wiring/circuit layer faced the via-hole conductors, and was pressed with a pressure of 30 kg/cm$^2$ (about 300 N/cm$^2$) at 130° C. for 30 seconds so that the wiring/circuit layer of the transfer sheet was buried in the insulating sheet. Then, the PET film of the transfer sheet was peeled off together with the adhesive layer to obtain a circuit sheet on which the wiring/circuit layer had been transferred.

It was confirmed that in this circuit sheet, the wiring/circuit layer had been completely buried in the surface of the insulating sheet, and the surface of the insulating sheet and the surface of the wiring/circuit layer had been positioned on the same plane.

In peeling off the PET film, presence of the adhesive was observed on the upper surface of the transferred wiring/circuit layer, and the results were listed on the column of transfer peeling of Table 4. In this Table, ○ represents a case of when there remained no adhesive, and X represents a case when there maintained the adhesive.

Six pieces of the circuit sheets were prepared in a manner as described above, overlapped one upon the other in a manner that the wiring/circuit layers and the insulating sheets were alternatingly arranged, and were press-adhered together with the application of pressure of 30 kg/cm$^2$ (about 300 N/cm$^2$) at 200° C. for one hour to obtain a multi-layer wiring board of a six-layer structure.

The obtained multi-layer wiring board was subjected to the soldering test and bias test in accordance with the following methods, and the results were as shown in Table 4.
Soldering Test:
After heated for soldering at 260° C. for 2 minutes, defective lamination was observed between the wiring/circuit layer and the insulating layer. Twenty pieces of the multi-layer wiring boards were subjected to the same testing, and the resistance against the soldering heat was evaluated in terms of the frequency of occurrence of defect in the lamination.
Bias Test:
A sample board was left to stand in an atmosphere of a temperature of 130° C. and a relative humidity of 85% for 300 hours. Then, a voltage of 5.5 V was applied to measure the insulating resistance of fine wire portions in the wiring/circuit layer.

Twenty pieces of the sample boards were subjected to the same testing. The sample boards exhibiting the insulating resistance of not lower than $10^9$ Ω were regarded to be of good quality, and the high-temperature high-humidity properties were evaluated in terms of the number of boards exhibiting insulating resistances smaller than the above value.

Examples 2 to 4, Comparative Examples 1 to 4

Films with metal foil, transfer sheets, circuit sheets and multi-layer wiring boards were prepared in quite the same manner as in Example 1 and were observed and evaluated in the same manner as in Example 1, but using adhesives prepared by changing the amount of acrylic acid in the acrylic polymer, and blending the polyfunctional compound, plasticizer (α) (di-2-ethylhexyl adipate) and anti-corrosive agent in amounts as shown in Tables 1 and 2, and were observed and evaluated in the same manner as in Example 1. The results were as shown in Tables 3 and 4.

Example 5

A film with a metal foil, a transfer sheet, a circuit sheet and a multi-layer wiring board were prepared in quite the same manner as in Example 1 but using an adhesive prepared by using a monofunctional compound (butyl glycidyl ether, BGE manufactured by Nihon Kayaku Co.) in addition to a polyfunctional compound as shown in Table 1, and were observed and evaluated in the same manner as in Example 1. The results were as shown in Tables 3 and 4.

Example 6 and 7, Comparative Examples 5 and 6

Films with metal foil, transfer sheets, circuit sheets and multi-layer wiring boards were prepared in quite the same manner as in Example 2, but using adhesives prepared by using a plasticizer (β) (epoxylated soybean oil manufactured by Asahi Denka Co., trade name: adekacizer-O-130P) in addition to the plasticizer (α) (di-2-ethylhexyl adipate) and changing the amount of the epoxy plasticizer and di-2-ethylhexyl adipate as shown in Tables 1 and 2, and were observed and evaluated in the same manner as in Example 1. The results were as shown in Tables 3 and 4.

In Tables 1 and 2, the plasticizer (α) was the di-2-ethylhexyl adipate, and the plasticizer (β) was the epoxylated soybean oil.

The amounts of the polyfunctional compounds, plasticizers (α) and (β), and anti-corrosive agents are per 100 parts by weight of the acrylic polymer.

In the column of polyfunctional compound of Example 5 in Table 1, "poly" represents the blending amount of the polyfunctional compound and "mono" represents the blending amount of the monofunctional compound.

TABLE 3

|  | Peeling force at 40° C. (N/cm) | Peeling force at 120° C. (N/cm) | Re-peeling force at 40° C. (N/cm) | Etching |
| --- | --- | --- | --- | --- |
| Example 1 | 5.59 | 0.98 | 9.11 | ○ |
| Example 2 | 3.92 | 0.98 | 6.62 | ○ |
| Example 3 | 2.45 | 0.49 | 4.29 | ○ |
| Example 4 | 1.96 | 0.29 | 3.14 | ○ |
| Example 5 | 4.30 | 0.99 | 7.71 | ○ |
| Example 6 | 4.12 | 0.88 | 5.59 | ○ |
| Example 7 | 6.27 | 1.32 | 6.76 | ○ |
| Comp. Example 1 | 7.84 | 1.47 | 12.94 | ○ |
| Comp. Example 2 | 2.45 | 0.10 | 4.04 | X |
| Comp. Example 3 | 1.47 | 0 | 2.50 | ○ |
| Comp. Example 4 | 4.41 | 0.10 | 7.94 | ○ |
| Comp. Example 5 | 2.40 | 0 | 2.00 | ○ |
| Comp. Example 6 | 6.00 | 1.15 | 10.55 | ○ |

TABLE 1

| Example | 1 | 2 | 3 | 4 | 5 | 6 | 7 |
| --- | --- | --- | --- | --- | --- | --- | --- |
| Butyl acrylate/parts by weight | 100 | 100 | 100 | 100 | 100 | 100 | 100 |
| Acrylic acid/parts by weight | 10 | 10 | 10 | 4 | 10 | 10 | 10 |
| Polyfunctional compound/parts by weight | 3 | 4 | 7 | 3 | poly: 3 mono: 1 | 4 | 4 |
| Plasticizer (α)/parts by weight | 2 | 2 | 2 | 2 | 2 | 2 | 4 |
| Anti-corrosive/parts by weight | 3 | 3 | 3 | 3 | 3 | 3 | 3 |
| Plasticizer (β)/parts by weight | 0 | 0 | 0 | 0 | 0 | 0.2 | 0.2 |
| Gel fraction/% by weight | 85 | 90 | 97 | 95 | 90 | 87 | 83 |
| Index of viscoelasticity |  |  |  |  |  |  |  |
| 40° C.; G' (dyne/cm$^2$) | 6E + 6 | 6E + 5 | 1E + 6 | 2E + 5 | 6E + 5 | 6E + 5 | 6E + 5 |
| tan δ | 2E − 1 | 2E − 1 | 4E − 1 | 3E − 1 | 2E − 1 | 2E − 1 | 1E − 1 |
| 120° C.; G' (dyne/cm$^2$) | 5E + 5 | 6E + 5 | 7E + 5 | 6E + 5 | 6E + 5 | 5E + 5 | 5E + 5 |
| tan δ | 2E − 3 | 3E − 3 | 2E − 3 | 2E − 3 | 3E − 3 | 1E − 2 | 1E − 2 |

TABLE 2

| Comparative Example | 1 | 2 | 3 | 4 | 5 | 6 |
| --- | --- | --- | --- | --- | --- | --- |
| Butyl acrylate/parts by weight | 100 | 100 | 100 | 100 | 100 | 100 |
| Acrylic acid/parts by weight | 10 | 1 | 1 | 15 | 10 | 10 |
| Polyfunctional compound/parts by weight | 2.5 | 4 | 7 | 4 | 3 | 4 |
| Plasticizer (α)/parts by weight | 2 | 2 | 2 | 2 | 4 | 4 |
| Anti-corrosive/parts by weight | 3 | 3 | 3 | 3 | 3 | 3 |
| Plasticizer (β)/parts by weight | 0 | 0 | 0 | 0 | 2 | 0 |
| Gel fraction/% by weight | 60 | 80 | 90 | 60 | 80 | 83 |
| Index of viscoelasticity |  |  |  |  |  |  |
| 40° C.; G' (dyne/cm$^2$) | 3E+5 | 1E+5 | 2E+5 | 3E+5 | 5E+5 | 5E+5 |
| tan δ | 1E−1 | 2E−1 | 1E−1 | 5E−1 | 4E−1 | 7E−1 |
| 120° C.; G' (dyne/cm$^2$) | 3E+5 | 1E+5 | 2E+5 | 1E+5 | 4E+5 | 4E+5 |
| tan δ | 2E−2 | 5E−2 | 3E−2 | 5E−2 | 1E−2 | 2E−2 |

TABLE 4

|  | Transfer peeling | Solding test | Bias test |
| --- | --- | --- | --- |
| Example 1 | ○ | 0/20 | 0/20 |
| Example 2 | ○ | 0/20 | 0/20 |
| Example 3 | ○ | 0/20 | 0/20 |
| Example 4 | ○ | 0/20 | 0/20 |
| Example 5 | ○ | 0/20 | 0/20 |
| Example 6 | ○ | 0/20 | 0/20 |

TABLE 4-continued

|  | Transfer peeling | Solding test | Bias test |
|---|---|---|---|
| Example 7 | ○ | 0/20 | 0/20 |
| Comp. Example 1 | X | 19/20 | 0/20 |
| Comp. Example 2 | ○ | 0/20 | 20/20 |
| Comp. Example 3 | X | 20/20 | 0/20 |
| Comp. Example 4 | X | 20/20 | 0/20 |
| Comp. Example 5 | X | 20/20 | 0/20 |
| Comp. Example 6 | X | 20/20 | 0/20 |

When a multi-layer wiring board is produced by using the film with metal foil of the present invention as will be comprehended from the results of above Examples, the metal foil is held with an adhesive maintaining a suitable adhering force. Therefore, even when the wiring/circuit layer is formed from the metal foil by etching, the metal foil is not peeled off or the wiring/circuit layer is not broken, and the etching solution does not infiltrate into between the adhesive and the metal foil. Further, the resin film can be easily peeled off in a state where the wiring/circuit layer is buried in the half-cured insulating sheet. At this moment, the adhesive is all peeled off together with the resin film without remaining on the wiring/circuit layer that is transferred.

Since the wiring/circuit layer is buried in the insulating substrate, the obtained multi-layer wiring board has a favorably flat surface enabling even a flip chip to be mounted thereon. Besides, a drop in the strength of the wiring board is effectively prevented that results from defective lamination of the layers.

The present invention is very advantageous for the production of the multi-layer wiring boards which are small in size, small in thickness, and possess highly dense fine circuitry maintaining a high precision. Besides, the production efficiency is markedly improved since the formation of the insulating sheet and the formation of the wiring/circuit layer can be simultaneously conducted through separate steps.

What is claimed is:

1. A film with metal foil in which a metal foil is stuck to one surface of a resin film via an adhesive layer; wherein said adhesive layer is formed of an adhesive obtained by crosslinking an acrylic polymer obtained by the copolymerization of a (meth)acrylic acid ester with a carboxyl group-containing radically polymerizable monomer, with a polyfunctional compound having a functional group reactive with the carboxyl group; and said adhesive has a storage modulus of shearing elasticity G' of not smaller than $2 \times 10^5$ dynes/cm$^2$, and a loss tangent tan δ of not smaller than 0.1 at 40° C., and a storage modulus of shearing elasticity G' of not smaller than $5 \times 10^5$ dynes/Cm$^2$, and a loss tangent tan δ of not larger than 0.04 at 120° C.

2. The film with metal foil according to claim 1, wherein said acrylic polymer is a copolymer of 100 parts by weight of a (meth)acrylic acid ester and 3 to 10 parts by weight of a carboxyl group-containing radically polymerizable monomer.

3. The film with metal foil according to claim 2, wherein said (meth)acrylic acid ester is represented by the following general formula (1),

$$CH_2=CR^1-COOR^2 \tag{1}$$

wherein R$^1$ is a hydrogen atom or a methyl group, and R$^2$ is an alkyl group having 4 to 10 carbon atoms.

4. The film with metal foil according to claim 1, wherein said adhesive is obtained by crosslinking the acrylic polymer with said polyfunctional compound in the presence of a monofunctional compound having said functional group.

5. The film with metal foil according to claim 1, wherein said adhesive is so crosslinked that the gel fraction which represents the amount of the adhesive that does not dissolve in tetrahydrofuran is not smaller than 70% by weight.

6. The film with metal foil according to claim 1, wherein said adhesive contains a plasticizer in an amount of from 0.05 to 5% by weight.

7. The film with metal foil according to claim 6, wherein said plasticizer is a phthalic acid diester or an aliphatic dibasic acid ester.

8. The film with metal foil according to claim 7, wherein said adhesive further contains an epoxy plasticizer in an amount of from 0.01 to 1% by weight.

* * * * *